US011367645B2

(12) United States Patent
Criminale et al.

(10) Patent No.: US 11,367,645 B2
(45) Date of Patent: Jun. 21, 2022

(54) TEMPERATURE TUNABLE MULTI-ZONE ELECTROSTATIC CHUCK

(71) Applicant: Applied Materials, Inc., Santa Clara, CA (US)

(72) Inventors: Phillip Criminale, Livermore, CA (US); Zhiqiang Guo, Sunnyvale, CA (US); Andrew Myles, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/352,349

(22) Filed: Mar. 13, 2019

(65) Prior Publication Data
US 2020/0294836 A1    Sep. 17, 2020

(51) Int. Cl.
*H01L 21/683*    (2006.01)
*H01L 21/67*    (2006.01)
*H01L 21/66*    (2006.01)
*H05B 1/02*    (2006.01)

(52) U.S. Cl.
CPC .... *H01L 21/6833* (2013.01); *H01L 21/67103* (2013.01); *H01L 21/67248* (2013.01); *H01L 21/67288* (2013.01); *H01L 22/20* (2013.01); *H05B 1/0233* (2013.01)

(58) Field of Classification Search
CPC ......... H01L 21/67103; H01L 21/67248; H01L 21/6831; H01L 22/20; H01L 21/67109
See application file for complete search history.

(56) References Cited

U.S. PATENT DOCUMENTS

| 2003/0186545 A1 | 10/2003 | Kamp et al. |
| 2008/0228308 A1 | 9/2008 | Phelps |
| 2010/0193501 A1 | 8/2010 | Zucker et al. |

(Continued)

FOREIGN PATENT DOCUMENTS

| EP | 1599891 A2 | 11/2005 |
| KR | 20190004867 A | 1/2019 |

OTHER PUBLICATIONS

PCT Notification of Transmittal of the International Search Report and the Written Opinion of the International Searching Authority for International Application No. PCT/US2020/015238; dated May 25, 2020; 13 total pages.

*Primary Examiner* — Tony Tran
(74) *Attorney, Agent, or Firm* — Patterson + Sheridan, LLP

(57) ABSTRACT

Implementations described herein provide a method for calibrating a temperature of a substrate support assembly which enables discrete tuning of the temperature profile of a substrate support assembly. In one embodiment, a system, comprises a memory, wherein the memory includes an application program configured to perform an operation on a substrate support assembly, a control board disposed in a substrate support assembly, wherein the control board comprises a processor having an wireless interface, a pulse width modification (PWM) heater controller, wherein the processor is connected with the memory to read and access the application program from the memory when in operation, and a heating element coupled to the pulse width modification (PWM) heater controller, wherein the heating element comprises a plurality of spatially tunable heaters that are individually tunable by the pulse width modification (PWM) heater controller.

6 Claims, 6 Drawing Sheets

(56) References Cited

U.S. PATENT DOCUMENTS

2013/0171746 A1     7/2013  Chang et al.
2015/0053347 A1     2/2015  Kimura et al.
2016/0345384 A1*   11/2016  Zhang .................... H01L 22/20
2016/0372352 A1    12/2016  Wu et al.

* cited by examiner

TEMPERATURE TUNABLE MULTI-ZONE ELECTROSTATIC CHUCK

BACKGROUND

Field

Implementations described herein generally relate to semiconductor manufacturing and more particularly to a temperature control or temperature calibration of an electrostatic chuck and method of using the same.

Description of the Related Art

As the feature size of the device patterns get smaller, the critical dimension (CD) requirements of these features become a more important criterion for stable and repeatable device performance. Allowable CD variation across a substrate processed within a processing chamber is difficult to achieve due to difficult chamber process parameter controls, such as chamber and substrate temperature deviations, flow conductance, and RF fields.

In processes utilizing an electrostatic chuck, uniformity of temperature control across the surface of the substrate is even more challenging due to the non-homogeneous construction of the chuck below the substrate. For example, some regions of the electrostatic chuck have gas holes, while other regions have lift pin holes that are laterally offset from the gas holes. Still other regions have chucking electrodes, while other regions have heater electrodes that are laterally offset from the chucking electrodes. Since the structure of the electrostatic chuck can vary both laterally and azimuthally, uniformity of heat transfer between the chuck and substrate is complicated and very difficult to obtain, resulting in local hot and cold spots across the chuck surface, which consequently result in non-uniformity of processing results along the surface of the substrate.

Additionally, in between each chamber maintenance or service, the temperature profile of the electrostatic chuck may vary. Thus, the temperature profile distributed across the electrostatic chuck is difficult to calibrate or control since temperature variations may occur across the hot and cold spots in the chuck surface.

Thus, there is a need for an improved substrate support assembly that can provide simple temperature calibration.

SUMMARY

Implementations described herein provide a method for calibrating a temperature of a substrate support assembly which enables discrete tuning of the temperature profile of a substrate support assembly. In one embodiment, a system, comprises a memory, wherein the memory includes an application program configured to perform an operation on a substrate support assembly, a control board disposed in a substrate support assembly, wherein the control board comprises a processor having an wireless interface, a pulse width modification (PWM) heater controller, wherein the processor is connected with the memory to read and access the application program from the memory when in operation, and a heating element coupled to the pulse width modification (PWM) heater controller, wherein the heating element comprises a plurality of spatially tunable heaters that are individually tunable by the pulse width modification (PWM) heater controller.

In another embodiment, a method of performing a process on a substrate support assembly includes performing a predetermined process on a substrate support assembly to obtain an initial temperature profile on an substrate disposed on the substrate support assembly, wherein the support assembly having primary heaters and spatially tunable heaters, determining a deviation temperature profile from a result of performing the predetermined process, determining tuning parameters by a processor disposed in the substrate support assembly, adjusting the initial temperature profile to a target temperature profile on the substrate support assembly using the tuning parameters in response to the deviation temperature profile, wherein adjusting to the target temperature profile comprises incrementing power provided to one or more of the spatially tunable heaters, and storing the tuning parameters and the deviation temperature profile in a memory disposed in the substrate support assembly.

In yet another embodiment, a method of performing a process on a substrate support assembly includes measuring a first temperature profile of a substrate support assembly when performing a process on a substrate disposed on the substrate support assembly, determining a temperature offset map by comparing the first temperature profile with a target temperature profile by a processor disposed in the substrate support assembly, determining tuning parameters by the processor to calibrate the first temperature profile to the second temperature profile for the substrate support assembly and storing the tuning parameters in a memory disposed in the substrate support assembly.

BRIEF DESCRIPTION OF THE DRAWINGS

So that the manner in which the above recited features of the present invention can be understood in detail, a more particular description of the invention, briefly summarized above, may be had by reference to implementations, some of which are illustrated in the appended drawings. It is to be noted, however, that the appended drawings illustrate only typical implementations of this invention and are therefore not to be considered limiting of its scope, for the invention may admit to other equally effective implementations.

To facilitate understanding, identical reference numerals have been used, where possible, to designate identical elements that are common to the figures. It is contemplated that elements disclosed in one implementation may be beneficially used in other implementations without specific recitation.

DETAILED DESCRIPTION

Figure 1:
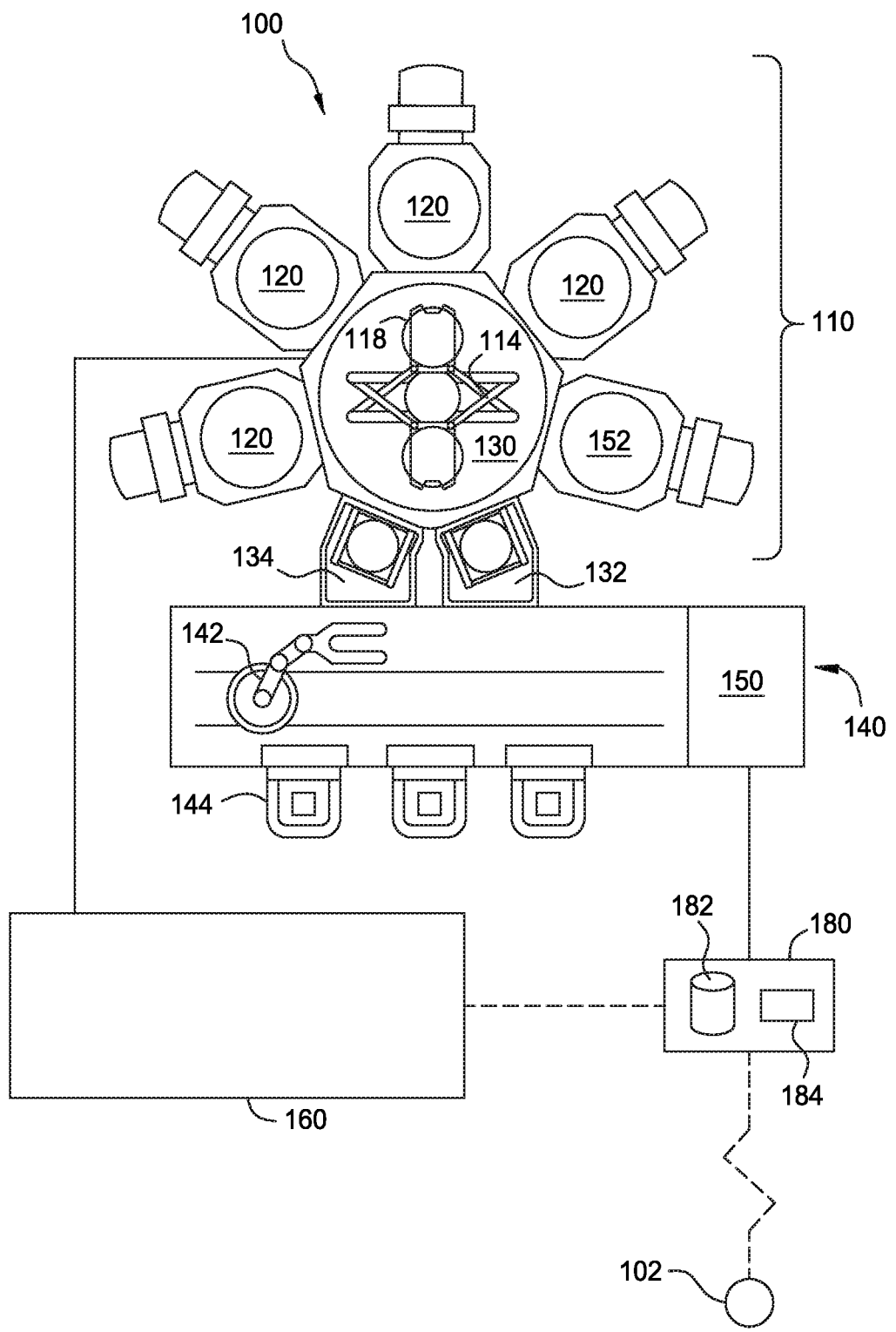
FIG. 1 is schematic top view of a multi-chamber vacuum processing system having at least one processing chamber.

Implementations described herein provide a method for calibrating spatially tunable heaters which enables discrete tuning of the temperature profile of a substrate support assembly. The calibration process comprises tuning or calibrating heat transfer between an electrostatic chuck (ESC) and a substrate. The method includes processing a substrate disposed on the ESC having a plurality of tunable heaters disposed therein to obtain a pre-calibrated temperature profile of the ESC. The substrate utilized to obtain the pre-calibrated temperature profile may be a dummy substrate or a calibration substrate. A temperature deviation profile is determined by comparing a result of processing the substrate (e.g., the result of the pre-calibrated temperature profile) with a target result profile. The power supplied to the heaters in the ESC are then calibrated and adjusted to match the pre-calibrated temperature profile of the ESC to the target result profile based on the deviation profile. Adjusting to the target result profile includes incrementing the power to one or more tunable heaters in one or more discrete locations corresponding to the deviations profile. The tuning parameters for the adjustment/calibration and the deviation profile is then stored in a memory embedded in the ESC.

Although the substrate support assembly having the spatially tunable heaters is described below in an etching processing chamber, the substrate support assembly may be utilized in other types of processing chambers, such as physical vapor deposition chambers, chemical vapor deposition chambers, ion implantation chambers, among others, and other systems where azimuthal tuning of a lateral temperature profile is desirable. It is also contemplated that the spatially tunable heaters may also be utilized to control the temperature of other surfaces, including those not used for semiconductor processing.

As will be appreciated by one of ordinary skill in the art, aspects of the present disclosure may be embodied as a system, method or computer program product. Accordingly, implementations of the present disclosure may take the form of an entirely hardware embodiment, an entirely software embodiment (including firmware, resident software, microcode, etc.) or an embodiment combining software and hardware aspects that may be referred to herein as a "circuit," "module" or "system." Furthermore, implementations of the present disclosure may take the form of a computer program product embodied in one or more computer readable medium(s) having computer readable program code embodied thereon.

Any combination of one or more computer readable medium(s) may be utilized for storing a program product which, when executed, is configured to perform method for scheduling a preventative maintenance event. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a non-volatile memory, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, radio, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as JAVA™, SMALLTALK™, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Embodiments of the disclosure may be provided to an end user facility through a cloud computing infrastructure. Cloud computing refers to the provision of scalable computing resources as a service over a network. More formally, cloud computing may be defined as a computing capability that provides an abstraction between the computing resource and its underlying technical architecture (e.g., servers, storage, networks), enabling convenient, on-demand network access to a shared pool of configurable computing resources that can be rapidly provisioned and released with minimal management effort or service provider interaction. Thus, cloud computing allows a user to access virtual computing resources (e.g., storage, data, applications, and even complete virtualized computing systems) in "the cloud," without regard for the underlying physical systems (or locations of those systems) used to provide the computing resources.

Typically, cloud computing resources are provided to a user on a pay-per-use basis, where users are charged only for the computing resources actually used (e.g., an amount of storage space consumed by a user or a number of virtualized systems instantiated by the user). A user can access any of the resources that reside in the cloud at any time, and from anywhere across the Internet. In context of the present invention, a user may access software routines (e.g., a method for detecting the breakage of one or more of the grounding straps) or related data available in the cloud. For example, the software routines could execute on a computing system in the cloud. In such a case, the software routines could maintain spatial and non-spatial data at a storage location in the cloud. Doing so allows a user to access this information from any computing system attached to a network connected to the cloud (e.g., the Internet).

FIG. 1 is schematic top view of a multi-chamber vacuum processing system 100 having at least one processing chamber 120. The multi-chamber vacuum processing system 100 also includes a system controller 160, a vacuum-tight processing platform 110 and a factory interface 140. The multi-chamber vacuum processing system 100 may additionally be attached to an advance process controller (APC) 180. The APC 180 may have a database 182 and a computing platform 184. The APC 180 may optionally be used in addition to the system controller 160 and integrates a plurality of process tools 102 at a manufacturing facility. The APC 180 may tracking operations and store metrics on substrates undergoing fabrication therein.

The factory interface (FI) 140 may have a plurality of front opening universal pods (FOUPs) 144 and at least one FI robot 142. The FI 140 may also have additional stations such as a metrology station 150. The metrology station 150 may be alternately be located adjacent the FOUPs 144. The FI robot 142 may have rails and a movable end effector, which may be a blade, plurality of fingers, gripper or other suitable apparatus for transferring a substrate 118 thereon. The FI robot 142 is operable at atmospheric conditions and is configured to have a range of motion sufficient to transfer substrates 118 disposed on the movable end effector between the FOUPs 144, the metrology station 150 and one or more load lock chambers 134, 132 of the processing system 100. The FOUPs 144 may hold a plurality of substrates 118 for transferring the substrates 118 to and from the multi-chamber vacuum processing system 100. For example, the FOUPs 144 may move the substrates 118 processed on the multi-chamber vacuum processing system 100 to a separate metrology station, chemical polishing station or other apparatus for further processing.

The load lock chambers 134, 132 are disposed between the factory interface 140 and the vacuum-tight processing platform 110 to facilitate substrate 118 transfers between a substantially ambient environment maintained in the factory interface 140 and a vacuum environment maintained in the vacuum-tight processing platform 110. The load lock chambers 134, 132 have one or more entry/exit slots (not shown) through which the substrate 118 may transfer into and out of the load lock chambers 134, 132 from the FI 140. Likewise, the load lock chambers 134, 132 have the same number of entry/exit slots through which the substrate 118 may transfer between the interior of the load lock chambers 134, 132 and the vacuum-tight processing platform 110. Each of the entry/exit slots of the load lock chambers 134, 132 is selectively sealed by a slit valve (not shown) to isolate the interior of the load lock chambers 134, 132 from the interiors of either the FI 140 or the vacuum-tight processing platform 110.

The vacuum-tight processing platform 110 has a plurality of attached chambers 120 disposed around a transfer chamber 130 in addition to the load lock chambers 134, 132. The transfer chamber 130 is coupled to a vacuum system (not shown) for providing a reduced atmosphere condition in the vacuum-tight processing platform 110. The transfer chamber 130 houses at least one transfer chamber robot 114. The transfer chamber robot 114 can rotate to transfer the substrate 118 with any of the chambers 120. One or more of the attached chambers 120 may include etch chambers or deposition chambers such as chemical vapor deposition chambers, physical vapor deposition chambers, or atomic layer deposition chambers, having a substrate support assembly 200 (shown in FIG. 2) for processing a substrate 118 thereon. Additionally, one of the attached chambers 120 may be a metrology chamber 152 having metrology equipment for measuring an attribute of the substrate 118, an orientation chamber, de-gas chamber or other suitable chamber for processing the substrate 118. In some embodiments, one chamber 120 may both etch and measure the substrate 118. For instance, metrology equipment for measuring an attribute of the substrate 118 may be incorporated into the chamber 120. Alternatively, metrology equipment for measuring an attribute of the substrate 118 may be located with the transfer chamber 130, the FI 140 or other convenience location.

The system controller 160 is coupled to and controls each chamber 120 and/or module(s) of the multi-chamber vacuum processing system 100. Generally, the system controller 160 may control all aspects of operation of the processing system 100 using direct control of chambers and apparatus of the processing system 100 or, alternatively, by controlling the computers associated with these chambers and apparatus. Furthermore, the system controller 160 may also be configured to communicate with a control unit associated with the transfer chamber robot 114 and other controllers through the APC 180. For example, movements of the transfer chamber robot 114, transferring the substrate 118 to and from the processing chambers 120 and performing process sequences, coordinating operations of the various components of the multi-chamber vacuum processing system 100, and so on, may be controlled by the system controller 160. Additionally, the system controller 160 may control the process recipes in the processing chamber 120. For example, the system controller may control the vacuum, chamber temperature, substrate support surface temperature profile, gas flow rate and various other processing parameters of the process recipe. In operation, the system controller 160 enables feedback from the respective chambers and apparatus to optimize substrate throughput.

The system controller 160 is discussed below with respect to FIG. 4. The system controller 160 may alter the process recipe for the substrate 118 undergoing processing in the chamber 120. The system controller 160 may use feedback from the metrology equipment to determine changes in the processing recipe. The metrology equipment may measure critical dimensions across the substrate 118 and alter process parameters, such as localized temperatures across the substrate support assembly, to change localized processing.

Figure 2:
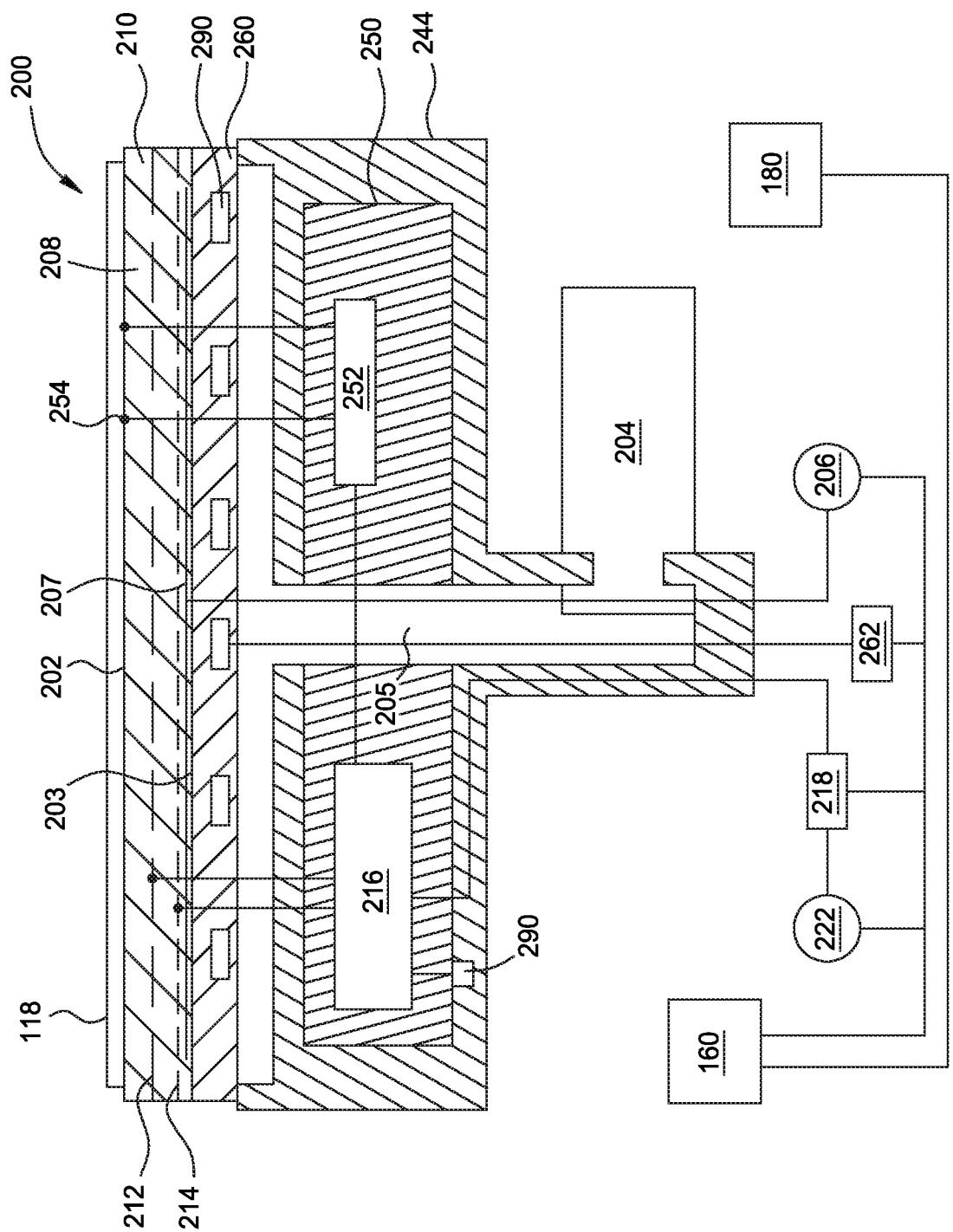
FIG. 2 is a partial cross-sectional schematic side view detailing portions of a substrate support assembly having spatially tunable heaters.

FIG. 2 is a partial cross-sectional schematic side view detailing portions of a substrate support assembly 200 configured to provide tuning of the temperature profile across the substrate support assembly. The tuning of the temperature profile across the substrate support assembly 200 may be controlled by software routines running on the controller 160. The substrate support assembly 200 may be disposed in any of the chamber 120 in the multi-chamber vacuum processing system 100. The software routines may also or alternately be stored and/or executed by a second controller (not shown) that is located remotely from the multi-chamber vacuum processing system 100, such as at the processing chamber 120 or the APC 180.

The substrate support assembly 200 generally includes at least a substrate support 210. The substrate support 210 may be a vacuum chuck, an electrostatic chuck, a susceptor, or other work-piece support surface. In one embodiment, the substrate support 210 is an electrostatic chuck and will be described hereinafter as the electrostatic chuck 210. The substrate support assembly 200 may also include a cooling base 260. The cooling base 260 may alternately be separated from the substrate support assembly 200. The substrate support assembly 200 may be removably coupled to a support pedestal 205. The support pedestal 205, which may include a pedestal base 244. The substrate support assembly 200 may be periodically removed from the support pedestal 205 to allow for refurbishment of one or more components of the substrate support assembly 200.

The electrostatic chuck 210 has a mounting surface 203 and a work-piece support surface 202 opposite the mounting surface 203 where the substrate 118 is removably disposed upon the work-piece support surface 202. The electrostatic chuck 210 generally includes a chucking electrode 207 embedded in a dielectric body 208. Although the chucking electrode 207 is shown proximate the mounting surface 203 of the electrostatic chuck 210, the chucking electrode 207 may be embedded in other portions of the electrostatic chuck 210, such as just under the work-piece support surface 202. The chucking electrode 207 may be configured as a mono polar or bipolar electrode, or other suitable arrangement. The chucking electrode 207 is coupled through an RF filter 204 to a chucking power source 206 which provides a RF or DC power to electrostatically secure the substrate 118 to the work-piece support surface 202 of the electrostatic chuck 210. The RF filter 204 prevents RF power utilized to form a plasma within the processing chamber 120 from damaging electrical equipment or presenting an electrical hazard outside the chamber.

The dielectric body 208 of the electrostatic chuck 210 may be fabricated from a ceramic material, such as AlN or $Al_2O_3$. Alternately, the dielectric body 208 may be fabricated from a polymer, such as polyimide, polyetheretherketone, polyaryletherketone and the like. Heaters may be embedded within the dielectric body 208. The dielectric body 208 may include one or more main resistive heaters 212 and/or a plurality of spatially tunable heaters 214. The main resistive heaters 212 may be provided to elevate the temperature of the substrate support assembly 200 to a temperature for conducting chamber processes, such as processing the substrate 118 and/or cleaning the interior of the processing chamber 120. The main resistive heater 212 may be configured to provide any one or more laterally separated heating zones, for example, a plurality of concentric ring-shaped zones. The spatially tunable heaters 214 are complimentary to the main resistive heaters 212 and configured to adjust the localized temperature of the electrostatic chuck 210 in a plurality of discrete locations within any one or more of a plurality of laterally separated heating zones defined by the main resistive heaters 212. For example, the spatially tunable heaters 214 may be arranged in a polar array, Cartesian grid of columns and rows, a hexagonal grid, or other suitable matrix. The spatially tunable heaters 214 thus provide localized adjustments to the temperature profile of the substrate 118 placed on the substrate support assembly 200. Thus, the main resistive heaters 212 operate to maintain the temperature profile of the work-piece support surface 202 on a globalized macro scale, while the spatially tunable heaters 214 operate to adjust the temperature at discreet locations of the temperature profile of the work-piece support surface 202 on a localized micro scale.

The main resistive heaters 212 and spatially tunable heaters 214 are coupled through an RF filter 218 to a heater power source 222. The heater power source 222 may provide 900 watts or more power to the heaters 212, 214. The controller 160 may control the operation of the heater power source 222, which is generally set provide power to individual heaters 212, 214 for heating the substrate 118 to a predefined temperature profile. In one embodiment, the main resistive heaters 212 include laterally separated heating zones, wherein the controller 160 enables one zone of the main resistive heaters 212 or even single spatially tunable heaters 214 to be preferentially heated relative to adjacent heaters 212, 214. In some embodiments, each spatially tunable heater 214 may be independently controlled to provide a temperature different than that of another one of the spatially tunable heaters 214. In some embodiments, a plurality, such as at least two and as many as all, of the spatially tunable heaters 214 are independently and/or simultaneously powered to provide a temperature profiled which is stable, which results in a steady and easily controlled temperature profile with desired localized temperature settings, which contributes to enhanced uniformity and predictability of substrate processing results.

The electrostatic chuck 210 may include one or more temperature sensors 254. The temperature sensors 254 may measure temperature at a plurality of discrete locations on the work-piece support surface 202. The temperature sensors 254 may provide temperature feedback information to the controller 160 for controlling the power applied by the heater power source 222 to the main resistive heaters 212 and the spatially tunable heaters 214. Additionally, the feedback information may be used to control the operations of the cooling base 260.

The electrostatic chuck 210 may be disposed on the temperature controlled cooling base 260. The temperature controlled cooling base 260 is coupled to a heat transfer fluid source 262. The heat transfer fluid source 262 provides a heat transfer fluid, such as a liquid, gas or combination thereof, which is circulated through one or more conduits 290 disposed in the cooling base 260. The controller 160 may control the fluid flowing through isolated neighboring conduits 290 to enabling local control of the heat transfer between the electrostatic chuck 210 and different regions of the cooling base 260, which assists in controlling the lateral temperature profile of the substrate 118.

The pedestal base 244 is disposed below the cooling base 260 and is configured to accommodate a plurality of driving mechanisms configured to raise and lower a plurality of lifting pins. Additionally, the pedestal base 244 is configured to accommodate the plurality of fluid connections from the electrostatic chuck 210 and the cooling base 260. The pedestal base 244 is also configured to accommodate the plurality of electrical connections from the electrostatic chuck 210. The myriad of connections, for example fluids, electrical, data signals, may run externally or internally of the substrate support assembly 200.

The system controller 160 includes a controller board 250 that is disposed in the pedestal base 244. Alternately, the controller board 250 may be disposed elsewhere inside or outside the substrate support assembly 200. The controller board 250 may have a pulse width modification (PWM) heater controller 216. The controller board 250 also may optionally have a temperature sensor controller 252.

The temperature sensor controller 252 may be communicatively coupled to the temperature sensors 254 for measuring the substrate 118 temperature. The temperature sensor controller 252 may convert the signals from the temperature sensors 254 to actual temperature readings in discrete locations about the work-piece support surface 202. The data of the actual temperature readings is then transmitted to the PWM heater controller 216 and further to the system controller 160 for analysis and calculation.

The PWM heater controller 216 may connect directly or indirectly to the heaters 212, 214. The PWM heater controller 216 may modify the power provided by the heater power source 222 to the individual heaters 212, 214. The PWM heater controller 216 may be programmed and calibrated by measuring the temperature at each spatially tunable heater 214. That is, each spatially tunable heater 214 has its own independent PWM control. The PWM heater controller 216 may control the temperature by adjusting the power parameters for individual spatially tunable heaters 214. For example, 100 percent power to one of the spatially tunable heater 214 may result in about 5 degrees Celsius of heat output for increasing the temperature set by the main heater for the surface location above the spatially tunable heater 214. Additionally, 20 percent power to one or more of the spatially tunable heaters 214 may result in about a 1 degree Celsius heat output for increasing the temperature set by the main heater for the surface location above the spatially tunable heaters 214. The power may be reduced to 20% for several of the spatially tunable heaters 214 and be maintained at that level throughout a processing operation. Additionally, the PWM heater controller 216 may operate one or more spatially tunable heaters 214 at a first power level, for example 80 percent, while simultaneously operating one or more separate spatially tunable heaters 214 at a second power level, for example about 20 percent. In one embodiment, the temperature may be regulated with incremental power increases to the spatially tunable heaters 214. For example, a temperature rise may be obtained with a percentage increase, for example 9% increase, in the power supplied to the spatially tunable heaters 214 during the course of a process. In another embodiment, the temperature may be regulated by cycling one or more of the spatially tunable heater 214 on and off, while the other tunable heaters 214 are also cycled on and off, either in-phase, or out of phase. In yet another embodiment, the temperature may be regulated by a combination of adjusting the power levels, cycling and incrementally adjusting the power to one or more of the spatially tunable heaters 214 as needed to maintain a desired temperature profile. In yet another example, the temperature across the electrostatic chuck 210 may be raised simultaneously by providing power to all of the spatially tunable heaters 214, 212 while maintaining the maintaining the same proportional power distribution between spatially tunable heaters 214 across electrostatic chuck 210. For example, a discreet area controlled by one of the spatially tunable heaters 214 may have higher temperature range about 0.5% temperature bias than a neighboring discreet area. Thus, while supplying a power to all the spatially tunable heaters 214, 212 across the electrostatic chuck 210, such electrostatic chuck 210 at the discreet area to its neighboring discreet is still maintained. Thus, by individual control of each of the spatially tunable heaters 214, such temperature bias may be controlled and adjusted so as to provide a relatively more uniform temperature distribution across the electrostatic chuck 210.

Figure 3:
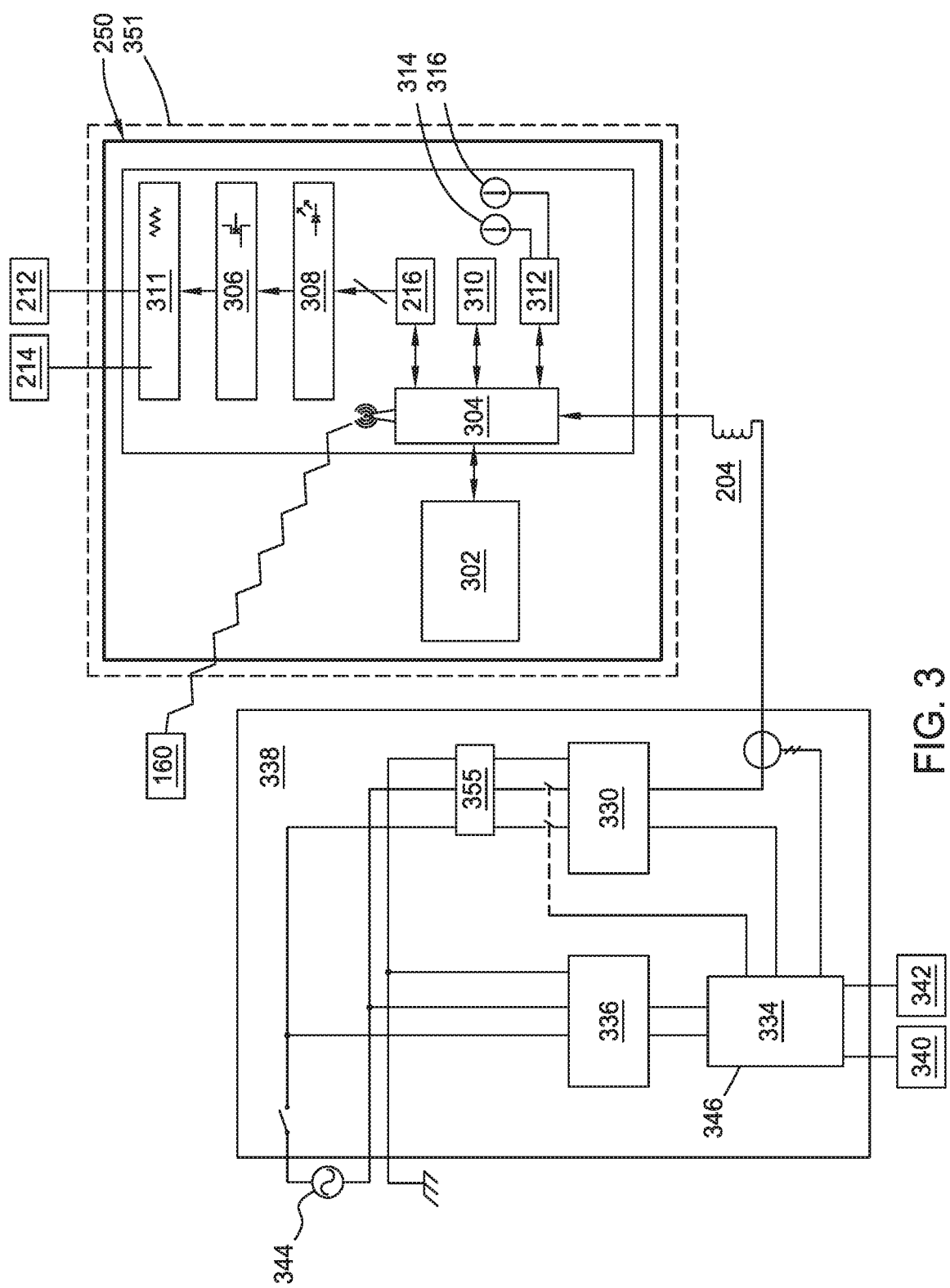
FIG. 3 is a block diagram of a control architecture of a system suitable for storing and executing software routines in which embodiments of the present disclosure may be implemented.

A temperature profile (e.g., a temperature map) may be obtained by varying the heat output of each individual spatially tuning heater 214 over a single instance. The measured temperature profile may correlate the substrate temperature profile to the power distribution curve for each spatially tunable heater 214. Thus, the spatially tunable heater 214 may be used to generate a temperature profile on the substrate based on a program regulating power settings for the individual spatially tunable heaters 214. The logic can be placed directly in the PWM heater controller 216, a memory 302 (as shown in FIG. 3), or another memory device (not shown) connected to the PWM heater controller 216 disposed in the pedestal base 244, or in an externally connected controller, such as the controller 160. Thus, the PWM heater controller 216 is configured to independently and separately control an output of each one of the plurality of spatially tunable heaters 214 relative to each of the other plurality of spatially tunable heaters 214, as well as the main resistive heaters 212.

The temperature of the surface for the substrate 118 in the processing chamber 120 may be influenced by the evacuation of the process gasses by the pump, the slit valve door, the plasma and other factors. The controller 160 may have a temperature profile map for the substrate 118 for obtaining high quality processing results. The controller 160 may receive input from the metrology equipment or other processing equipment to correct for deviation or adverse trends in the process results of the substrate 118. For example, one area of the substrate 118 may be processed faster than another area of the substrate 118. The controller 160 may signal the spatially tunable heaters 214 to adjust the surface temperature of the substrate 118 in the area deviating in the processing rate, such as performing a calibration process. The controller 160 may adjust the spatially tunable heaters 214 in a pattern similar in shape of the area having the different processing rate. The spatially tunable heaters 214 can be adjusted to improve the temperature profile of the surface of the substrate 118 produced by the main resistive heaters 212 by reducing variations in the temperature profile to about +/−0.3 degrees Celsius. The temperature profile may be made uniform or to vary precisely in a predetermined manner across regions of the substrate 118 through the use of the spatially tunable heaters 214 to obtain desired results. The use of independently controllable spatially tunable heaters 214 to smooth out or correct the temperature profile generated by the main resistive heaters 212 enable control of the local temperature uniformity across the substrate to very small tolerances, thus enabling precise process across the electrostatic chuck 210 when processing the substrate 118. Additionally, the small size and high density of the spatially tunable heaters 214 relative to the main resistive heaters 212 enables temperature control at specific locations on the electrostatic chuck 210, substantially without affecting the temperature of neighboring areas, thus allowing local hot and cold spots to be compensated to achieve desired temperature profiles as well as enhance localized temperature control.

It is contemplated that there may be about 100 to about 400, or even more spatially tunable heaters 214 in a given embodiment of a substrate support assembly 200 configured for use with a 300 mm substrate. Even more spatially tunable heaters 214 are contemplated for substrates of 450 mm or larger. Exemplary distribution of the spatially tunable heaters 214 are described further below with reference to FIG. 4. In one example, there are between about 150 and about 300 spatially tunable heaters 214 in the example depicted in FIG. 1-2.

FIG. 3 depicts a block diagram of the control board 250 disposed in the pedestal base 244 in an RF environment 351, as indicated in the dashed line. As described above, the control board 250 includes the PWM heater controller 216 disposed therein. The PWM heater controller 216 is coupled to a processor 304 that may be wirelessly controlled. The processor 304 may send command or signal to the PWM heater controller 216. The commend or signal may be preset to control the set-points sent to the PWM heater controller 216 to further control the heaters 212 214. The processor 304 may be wirelessly controlled or communicate with the controller 160 directly or through an external controller 338 electrically connected to the processor 304. The external controller 338 may further communicate with the controller 160 in any suitable manner.

The PWM heater controller 216 is coupled to an isolator 308. The isolator 308 receives the PWM signals from the PWM heater controller 216. The isolator 308 may be an opto-isolator. The isolator 308 is the further coupled to a switching device 306. The PWM heater controller 216 may turn on or off one or more of the switching device 306, which is further coupled to a heating element 311. The heating element 311 connects with the spatially tunable heaters 214 and the main resistive heaters 212 to provide individual control of the spatially tunable heaters 214 and the main resistive heaters 212 disposed in the electrostatic chuck 210. The PWM heater controller 216 may control at least one or more of the duty cycle, voltage, current, or duration of power applied to the heating element 311 through the switching device 306. In one embodiment, the PWM heater controller 216 receives a command that sets a duty cycle of a pin or output from the controller 160 and/or from the processor 304. The PWM heater controller 216 then turns on and off the switching device 306 according to the set duty cycle. By increasing and decreasing the duty cycle, the PWM heater controller 216 may control an amount of time that the switching device 306 is turned on verses the amount of time that the switching device 306 is turned off. The switching device 306 provides power and control to heating element 311 when turned on. By controlling the duty cycle of the switching device 306, the amount of power delivered to the heating element 311 may be controlled to a high degree of accuracy. The PWM heater controller 216 may toggle the on/off state or control the duty cycle for individual spatially tunable heaters 214 and the main resistive heaters 212 coupled to the heating element 311. Alternately or additionally, the PWM heater controller 216 may control the amount of power delivered to the individual heaters 212, 214 coupled to the heating element 311. It is noted that the control board 250 may include multiple PWM heater controller 216, and each PWM heater controller 216 may control multiple switching devices 306 (e.g., transistors, thyristors, triacs, etc.) and elements coupled to those switching devices 306.

The PWM heater controller 216 may control the temperature of the individual heaters 212, 214 by adjusting the power parameters supplied to the heaters 212, 214. The input command to be input to the PWM heater controller 216 for controlling the temperature of the individual heaters 212, 214 may come from the user input from the processor 304 which may be further wirelessly controlled or communicated by the controller 160. In one embodiment, the temperature may be regulated with incremental power increases to the heaters 212, 214. For example, a temperature rise may be obtained with a percentage increase, for example 9% increase, in the power supplied to the heating element. In another embodiment, the temperature may be regulated by cycling the heating element on and off. In yet another embodiment, the temperature may be regulated by a combination of cycling and incrementally adjusting the power to each heating element. A temperature profile (e.g., map) may be obtained using this method. The temperature profile may correlate the temperature to the power distribution curve for each individual heating element. Such temperature profile is then transmitted to the PWM heater controller 216 and further to the processor 304. Thus, the individual heating element may be used to generate a temperature profile on the substrate based on a program regulating power settings for the individual heating elements from the PWM heater controller 216 and further to the processor 304. The logic can be placed directly in the PWM heater controller 216, the processor 304, or in another processing device, such as the memory 302 that is included in the control board 250. It is noted that the temperature profile as measured and calibrated may be stored in the memory 302, which may communicate with the processor 304 for repetitive use or database for future calibration.

In some examples, the processor 304 is operable to automatically execute instructions stored in the memory 302 upon application of power above a predefined threshold so that the temperature calibration process may be automatically triggered as needed.

The control board 250 additionally includes one or more sensors, such as first sensor 314 and second sensor 316. The first sensor 314 and second sensor 316 may be analog sensors, and may be connected to an analog signal receiver 312, which may receive analog measurement signals from the first sensor 314 and second sensor 316. The received analog measurement signals from the analog signal receiver 312 are then transmitted to the processor 304 to transform the analog measurement signals into digital measurement signals. The converted digital electrical measurement signals is then converted into the digital optical measurement signals or other measurement signals to an digital signal output 310, which may further transmit such signals to the PWM heater controller 216 for heating element control. The first sensor 314 and/or second sensor 316 may alternatively be digital sensors that output a digital measurement signals to the processor 304 that may further be transmitted to the PWM heater controller 216.

The external controller 338 is electrically connected to the processor 304. The RF filter 204 is disposed between the processor 304 and the external controller 338. The external controller 338 includes a first power supply 336 that powers components of the external controller 338 and a second power supply 330 that powers the processor 304 disposed in the control board 250. The first power supply 336 is coupled to a power source 344 and the second power supply 330 is also coupled to the power source 344. The second power supply 330 is coupled to the power source 344 through an AC contactor 355. The first power supply 336 may include a current/voltage clamp, such as a single current/voltage clamp in the external controller 338 that can measure or monitor the voltage level of the first power supply 336. The RF filter 204 separates the second power supply 330 from the control board 250. As discussed above, the RF filter 204 filters out RF noise introduced to a power line by the RF environment 351 to protect the external controller 338. In one example, the second power supply 330 provides a voltage power in a range between about 9 Volts and 40 Volts to the processor 304.

The external controller 338 further comprises a processing device 334 that may be in communication with the controller 160. The processing device 334 may be powered by the first power supply 336. The processing device 334 includes a simple digital input, a digital output, an analog input and an analog output interface that may receive signals from an ECAT (e.g., EtherCAT or Ether Control Automation Technology) input port 340 and an ECAT output port 342 or from an Ethernet TCP-IP. The processing device 334 is in communication with the controller 160 to provide command and signals to the processing device 334. The ECAT input port 340 and an ECAT output port 342 that are external to the RF environment 351 as well as the control board 250 may further transmit signal or command to the processing device 334 as needed. The controller 160 generates commands and sends the commands to processing device 334 in accordance with user input. For example, a user may provide input selecting a process recipe and issuing a command to execute the process recipe. The processing device 334 may generate one or more additional commands based on the command received from the controller 160. For example, the controller 160 may send a command to the processing device 334 that causes the processing device 334 to generate instructions for ECAT input port 340 and an ECAT output port 342 and another instruction for the control board 250 as needed. The instructions may be an analog signal or a digital signal. Accordingly, the processing device 334 is capable of generating commands for controlling multiple different types of digital and analog devices that are both inside RF environment 351 and outside RF environment 351.

Thus, the first and the second power supply 336, 330 in the external controller 338 are mostly utilized to supply power to the processing device 334 and the control board 250 to perform the temperature calibration process to the heaters 212, 214 in the electrostatic chuck 210. Accordingly, a relatively compact architect of the external controller 338 is utilized. A programmable logic controller (PLC) or a programming processor, which is often found in the conventional controller, may be eliminated to save space and reduce the footprint of the external controller 338. The relatively predictable low level of the power from the first and the second power supply 336, 330 may be utilized to power the heating element 311 through the PWM heater controller 216. Thus, one single current clamp in the second power supply 330 (or the first power supply 336) is generally sufficient to control the voltage and current level utilized in the external controller 338 to power the heating element 311 in the control board 250.

In the embodiment when the electrostatic chuck is powered off, a power may further be supplied from the second power supply 330 through the processor 304 to the memory 302 to access the information (e.g., data or temperature distribution map) as needed. For example, the temperature distribution map and/or the heater power adjustment distribution map may be off-line accessed as needed by utilizing the control of the second power supply 330 in the external controller 338. Thus, the information stored in the memory 302 of the electrostatic chuck may be easily access even the processing chamber or the electrostatic chuck is off line and not in operation.

Figure 4:
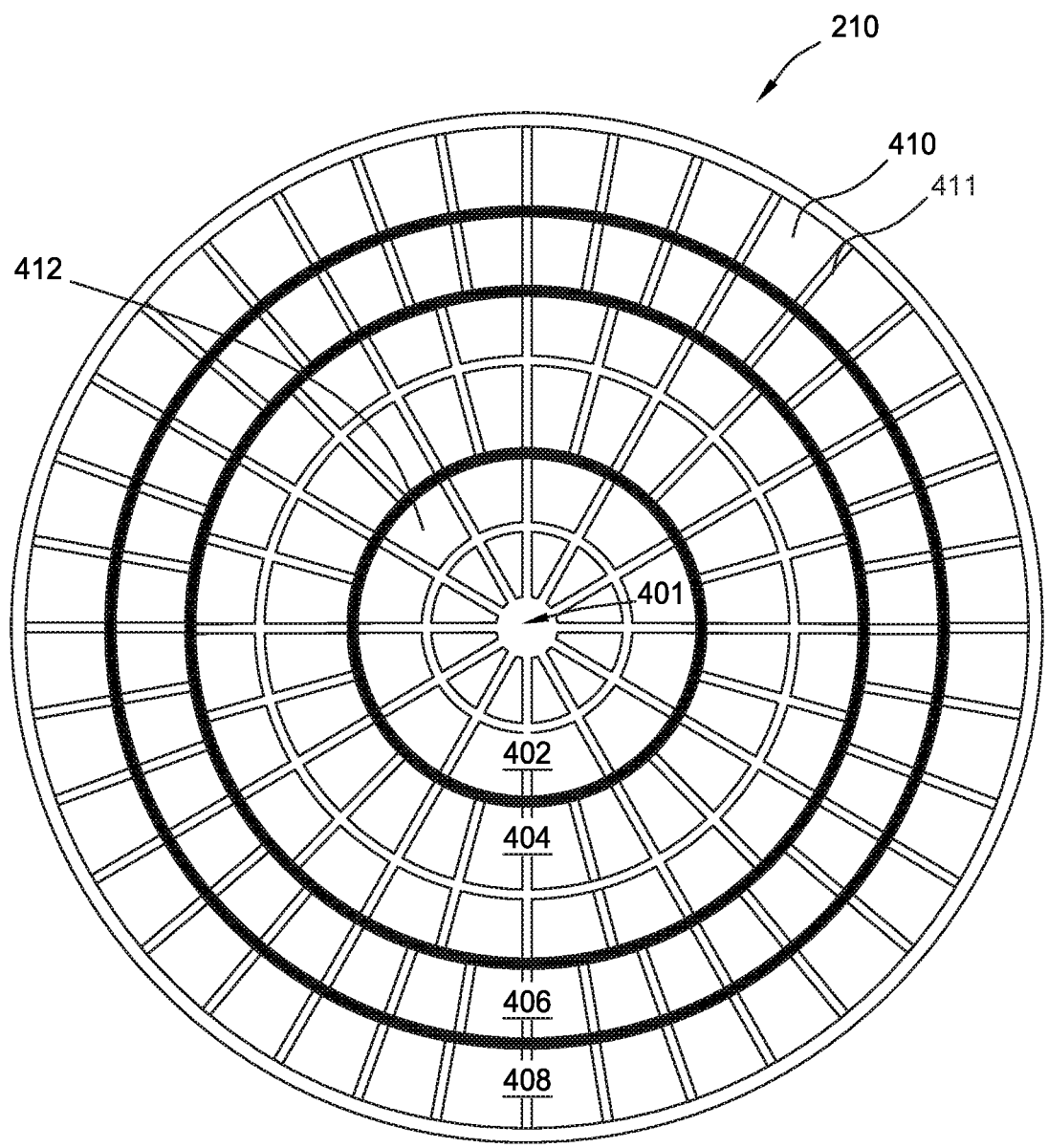
FIG. 4 is a top view of the substrate support assembly illustrating example layouts for the spatially tunable heaters.

FIG. 4 is a top view of the electrostatic chuck 210 illustrating example layouts of cells 410, 412 having the spatially tunable heaters 214 therein. The cells 410, 412 may have material (or gaps) which act as a thermal choke 411 between adjacent cells 410, 412. The thermal chokes 411 separate and reduce conduction between adjacent cells 410, 412. Thus, by individually and independently controlling the power provided to each spatially tunable heaters 214 in each cell 410, 412, a localized approach is achieved for controlling the temperature which enables specific points of the substrate 118 to be heated or cooled, thus enabling a truly addressable lateral temperature profile tuning and control of the surface of the substrate 118.

The thermal choke 411 is disposed between each neighboring cell 410, 412. Each cell 410, 412 has associated therewith at least one of the spatially tunable heaters 214. The number of cells 410, 412 shown is for illustration only, and any number of embodiments may have substantially more (or less) cells 410, 412. The number of spatially tunable heaters 214 may be at least an order of magnitude greater than the number of main resistive heaters 212. The number of spatially tunable heaters 214 located across the substrate support assembly 200 may easily be in excess of three hundreds, such as greater than five hundreds.

The spatially tunable heaters 214 may be configured in a pattern to efficiently generate a heat profile along the surface of the electrostatic chuck 210. The pattern may be symmetric or asymmetric about a center point 401 of the electrostatic chuck 210. Each spatially tunable heater 214 may be controlled by the controller 160 through the PWM heater controller 216 through the wireless control from the processor 304. The PWM heater controller 216 may turn on a single spatially tunable heater 214 defining a local area; or a plurality of spatially tunable heaters 214 grouped to define different concentric zones or a Cartesian grid, such as different zones 402, 404, 406, 408, or other desired geometric configurations, including non-contiguous configurations for determining a desired temperature profile. In this manner, temperature can be precisely controlled at independent locations along the surface of the electrostatic chuck 210, such independent locations not limited to concentric rings, or other center to edge configurations known in the art.

In the example depicted in FIG. 4, the spatially tunable heaters 214 are arranged in concentric channels defined in multiple concentric zones 402, 404, 406, 408, thus defining a polar of individual temperature controllable cells 410, 412. The multiple concentric zones 402, 404, 406, 408 are defined around the center point 401 of the electrostatic chuck 210. The concentric channel pattern of the spatially tunable heaters 214 in each concentric zone 402, 404, 406, 408 may be optionally separated by the thermal chokes 411. It is contemplated that the spatially tunable heaters 214 and cells 410, 412 may be arranged in other orientations. It should be appreciated, as discussed supra, the spatially tunable heaters 214 may be activated in groups or singularly, including independent control within a single zone.

The number and density of the spatially tunable heaters 214 contribute to the ability for controlling the temperature uniformity across the substrate to very small tolerances which enable precise process when processing the substrate 118. Additionally, individual control for one of the spatially tunable heaters 214 relative to another spatially tunable heater 214 enables temperature control at discrete locations along the surface of the substrate support assembly 200 without substantially affecting the temperature of neighboring or adjacent areas of the surface. This feature allows local hot and cold spots to be compensated. The spatially tunable heaters 214 may have an individual temperature range between about 0.0 degrees Celsius and about 50.0 degrees Celsius with the ability to control the temperature rise in increments of about 0.1 degrees Celsius. In one embodiment, the plurality of spatially tunable heaters 214 in the substrate support assembly 200 in conjunction with the main resistive heaters 212 have demonstrated the ability to control the temperature uniformity of a substrate 118 processed thereon to less than about ±0.3 degrees Celsius. Thus, the spatially tunable heaters 214 allow both lateral and azimuthal tuning of the lateral temperature profile of the substrate 118 processed on the substrate support assembly 200.

The heaters 214, 212 may be controlled by a software routine. The software may incorporate current substrate temperature profile map and the calibration methods to tune the temperature profile for the substrate 118 in the process chamber 120.

Figure 5:
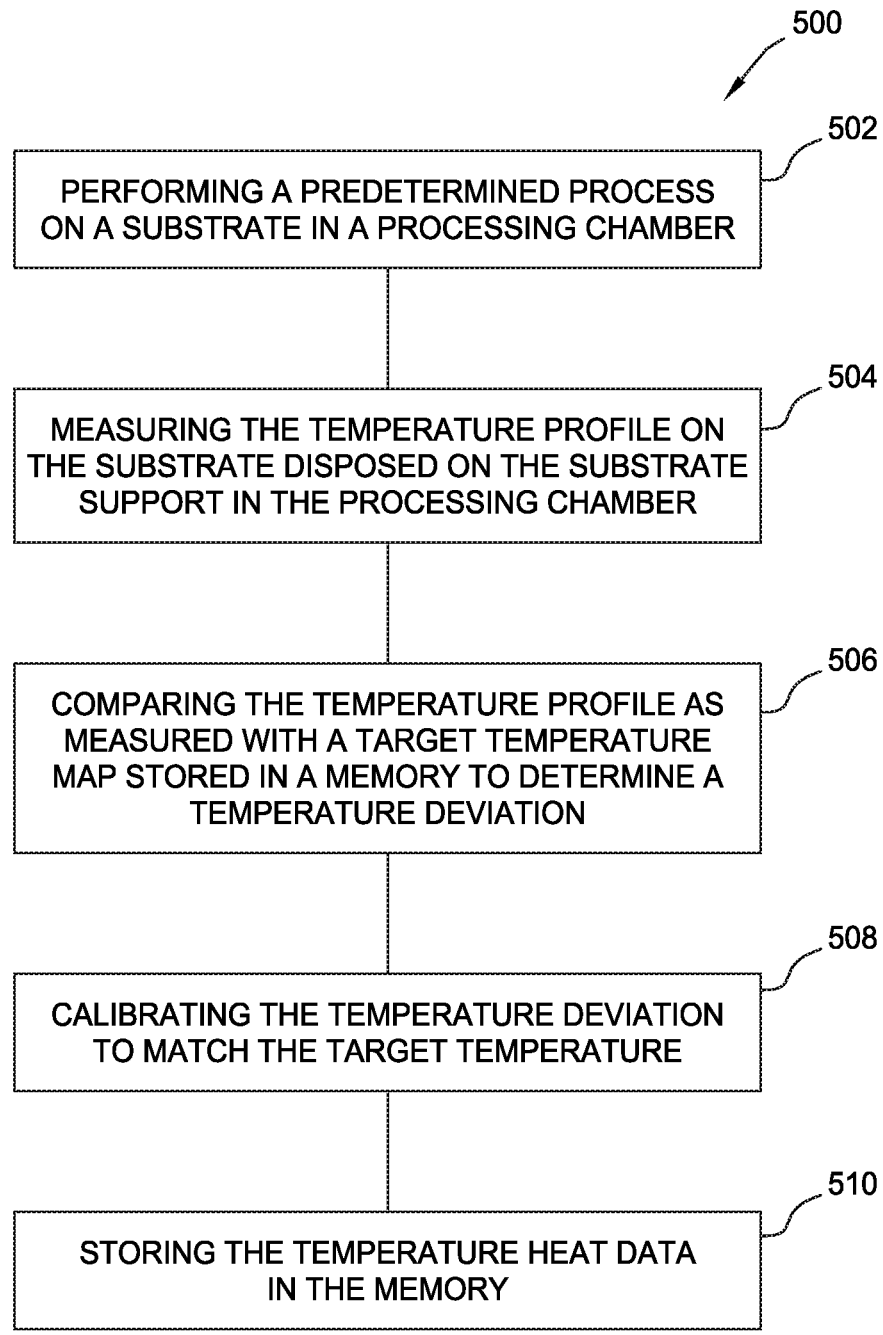
FIG. 5 is a flow diagram for performing a temperature calibration process for the spatially tunable heaters according to one embodiment.

FIG. 5 depicts a process 500 that may be utilized to calibrate substrate support temperature utilizing the individual controllable heaters 214, 212. The process 500 may be saved in the controller 160, or the memory 302 in the control board 250 so that the calibration process is readily accessible to perform the calibration after a preventive maintenance or other services at the customer site (or other locations other than manufacturing site) as needed. The flow diagram may be implemented as a software routine on a computing device. The spatially tunable heaters are independently controllable and determine a temperature profile of substrates processed thereon. The controller may alter the heat generated by one spatially tunable heater relative another by controlling at least one or more of the duty cycle, voltage, current, duration of power applied separately to each individual spatially tunable heater relative another. The power supplied to the spatially tunable heaters may also provide simultaneously between a plurality of heaters as described above, or alternatively, sequentially scanned across individual spatially tunable heaters. A work-piece, such as the substrate 118, may be processed on the substrate support assembly, to help collect and calibrate the temperature profile on the substrate support assembly 200. For example, the substrate may be processed in a vacuum chamber, for example using a plasma process. The vacuum process, which may be optionally performed in the presence of a plasma within the processing chamber, may be one of etching, chemical vapor deposition, physical vapor deposition, ion implantation, plasma treating, annealing, oxide removal, abatement or other plasma process. It is contemplated that the work-piece may be processed on the temperature controlled surface in other environments, for example, at atmospheric conditions, for other applications.

The process 500 begins at operation 502 by performing a predetermined process on a substrate, such as the substrate 118 disposed on the substrate support assembly 200. It is noted that the substrate 118 may be a regular production wafer, a calibration wafer or a dummy wafer as needed. The predetermined process may be a process that will be utilized to obtain the temperature profile distributed across the substrate support assembly 200.

At operation 504, a pre-calibrated substrate temperature profile is obtained based on the predetermined process performed at operation 502. The temperature profile may be measured by the temperature sensors 254 (as indicated in FIG. 2) and then transmitted to the controller 160 for further processing and/or analysis.

At operation 506, after the pre-calibrated substrate temperature profile is analyzed and compared with a target temperature profile stored in the controller 160 and/or the memory 302, a temperature offset (e.g., a temperature deviation) map is determined. The temperature offset (e.g., a temperature deviation) map may further determine temperature tuning parameters. The temperature offset was feedback to the temperature tuner, such as the PWM heater controller 216 or the processor 304, to determine a tuning map or tuning heating profile. For example, the tuning map may determine how much temperature increase or decrease is needed for each cells 410, 412. Accordingly, the power supplied to each of the spatially tunable heaters 214 and/or the main resistive heaters 212 may be adjusted to provide different level/amount of the voltage level thereto, which may influence of the thermal energy generated by the spatially tunable heaters 214 and/or the main resistive heaters 212. As a result, a localized temperature adjustment and offset may be tuned based on the tuning map, so as to provide a desired uniform temperature profile across the ESC.

At operation 508, the tuning map of the ESC is used to determine temperature tuning parameters to calibrate the predetermined discrete heaters 212, 214 located in the designated zones. Thus, the calibration process is performed based on the temperature tuning parameters determined from the tuning map based on the temperature offset (e.g., the temperature deviation) map. The control for each spatially tunable heater 214 can be performed simultaneously in the electrostatic chuck 210 allowing any selection of spatially tunable heaters 214 to quickly generate a specific temperature profile/map. Control/supply of the power from the second power supply 330 to the individual spatially tunable heaters 214 may be provided through the external controller 338. The PWM heater controller 216 adjusts the power supplied to each individual spatially tunable heater 214 so that different thermal energy may be provided from the spatially tunable heater 214 to locally control the temperature setting of the ESC in order to achieve the desired temperature profile. While the power to one spatially tunable heater 214 is being adjusted, the other spatially tunable heaters 214 may be turned off or held at a given output. Alternatively, the power to a plurality, such as two, more or all, of the spatially tunable heater 214 may be adjusted simultaneously. There may be 150 or more spatially tunable heaters 214 with each spatially tunable heater 214 being individually controlled for obtaining customizable heat output. For example, the processor 304 may indicate to the PWM heater controller 216 to provide 20 percent power to one spatially tunable heater, e.g. spatially tunable heater$_x$, to achieve about a 1 degree Celsius temperature increase in a first location adjacent that heater. The processor 304 may simultaneously instruct the PWM heater controller 216 to provide 80 percent power to a second spatially tunable heater, e.g. spatially tunable heater$_y$, to achieve about a 4 degree Celsius increase in a second location adjacent that heater. In this manner, up to 100 percent of the spatially tunable heaters may be individually controlled simultaneously for creating a unique temperature profile.

Conventionally, some optical communications, such as fiber optic connections or optic feed through, may be utilized to assist transmitting the signals to determine the tuning parameters for tuning the heaters. However, such optical communications often require additional optical devices disposed in the substrate support assembly 200, which may adversely increase the manufacturing cost or measurement complexity. In contrast, in the present disclosure, direction communication between the PWM heater controller 216, the processor 304 and the second power supply 330 after feedback control from the temperature sensors 254 may eliminate use of such optical devices. Thus, a compact structure of the substrate support assembly 200 as well as a simple design of the control board 250 may be obtained to enhance the data communication and simplify the turning process control. Furthermore, the wireless interface from the processor 304 may also assist control the turning of the temperature in a more instant, efficient and dynamic fashion. The second power supply 330 may simultaneously provide power to one spatially tunable heater 214 through the PWM heater controller 216 while cycling another spatially tunable heater 214 and cycling still other spatially tunable heaters 214 at different overlapping time intervals. In this manner, the spatially controllable heaters 214 may have a temperature profile across the substrate support made to match the temperature tuning parameters set from the tuning map.

At operation 510, after the calibration process is completed, the tuning map, as well as other information, such as temperature deviation or offset map, powers supplied from the second power supply 330, the commend from the PWM heater controller 216 and the determined tuning parameters, may be stored in the memory 302, which may be easily accessible and readable by the controller 160 and/or the processor 304. The tuning map as well as the temperature offset and deviation profile and the determined tuning parameters stored in the memory 302 may be repeatedly referenced to calibrate the temperature profile of the substrate support assembly 200 after a preventive maintenance is conducted or in any suitable situations which need the calibration process.

Figure 6A:
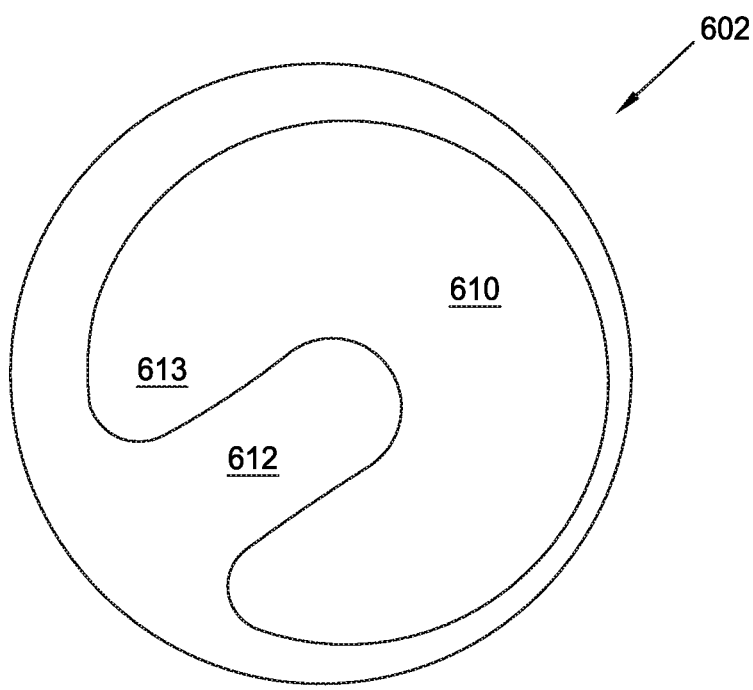
FIG. 6A-6B are substrate temperature profiles prior to and after the temperature calibration process of FIG. 5.
Figure 6B:
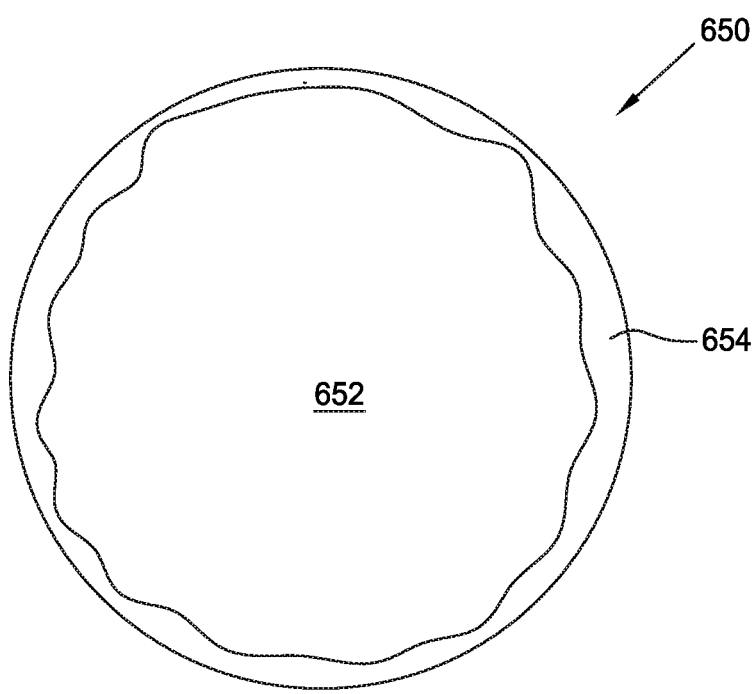

FIGS. 6A and 6B are temperature profiles of the substrate 118 prior to and after the temperature calibration process. After the temperature measurement at operation 504, a pre-calibrated substrate temperature profile or map 602 may be obtained, as shown in FIG. 6A. In the example of FIG. 6A, the pre-calibrated substrate temperature profile 602 may be in asymmetric configuration that has roughly three different temperature zones 610, 612, 613. The first zone 612 is formed slightly off the center and has a higher temperature than the second zone 613 and the third zone 610. The relatively higher temperature at the first zone 612 may adversely process the substrate at a rate different from the second and the third zones 613, 610. After the temperature calibration process at operation 508 is completed, the temperature in the second and third zone 613, 610 may be increased by increasing the power supplied to the heaters 214 located in the second and third zones 613, 610. Alternatively, the temperature in the first zone 612 may be lowered by decreasing the power supplied to the heaters 214 located in the first zone 612. Thus, after the temperature calibration, the calibrated temperature profile (e.g., the temperature map) 650 is substantially more uniform across the substrate, as shown in FIG. 6B, with a center zone 652 with a desired temperature range while an small edge zone 654 with a slightly lower or higher temperature from the center zone 652. Thus, a uniform temperature profile across the substrate support assembly 200 is obtained.

Advantageously, the calibration process can provide and control the temperature uniformity across the substrate support assembly during a substrate processing process. The individual spatially tunable heaters may be used to promote localized temperature control and compensation to enhance temperature uniformity across the substrate support assembly. The use of direct communication from a power supplied to the PWM heater controller 216, which may further utilize to adjust the heat generated from the spatially tunable heaters, may provide an efficient and simple control of the temperature profile without using conventional optical devices for measurement. Thus, the spatially tunable heaters tune the temperature profile to compensate for variation over time.

While the foregoing is directed to implementations of the present invention, other and further implementations of the invention may be devised without departing from the basic scope thereof, and the scope thereof is determined by the claims that follow.

What is claimed is:

1. A method of performing a process on a substrate support assembly, the method comprising in sequential order:
    performing a predetermined process on a substrate support assembly to obtain an initial temperature profile on a substrate disposed on the substrate support assembly, wherein the support assembly having primary heaters and spatially tunable heaters;
    determining and storing a deviation temperature profile from a result of performing the predetermined process;
    determining and storing tuning parameters by a processor disposed in the substrate support assembly; and
    adjusting the initial temperature profile to a target temperature profile on the substrate support assembly using the tuning parameters in response to the deviation temperature profile, wherein adjusting to the target temperature profile comprises incrementing power provided to one or more of the spatially tunable heaters,
    wherein the tuning parameters and the deviation temperature profile are stored in a memory disposed in a control board embedded in the substrate support assembly, and wherein the control board comprises:
        a processor having an wireless interface;
        a pulse width modification (PWM) heater controller, wherein the processor is connected with the memory to read and access the application program from the memory when in operation; and
        a heating element coupled to the pulse width modification (PWM) heater controller, wherein the heating element comprises a plurality of spatially tunable heaters that are individually tunable by the pulse width modification (PWM) heater controller.

2. The method of claim 1, wherein the processor is wirelessly controllable.

3. The method of claim 1, wherein the incrementing power is supplied from a power supply disposed in an external controller disposed externally from the substrate support assembly.

4. The method of claim 3, wherein external controller comprises a single current clamp.

5. The method of claim 1, wherein the processor is communicable with the memory to read the tuning parameters and the deviation temperature profile stored in the memory.

6. The method of claim 1, wherein the spatially tunable heaters are simultaneously powered, and wherein at least two of the spatially tunable heaters have different percent power outputs.

* * * * *